United States Patent
Cho (12)

(10) Patent No.: US 10,628,332 B2
(45) Date of Patent: Apr. 21, 2020

(54) SEMICONDUCTOR DEVICE, SEMICONDUCTOR SYSTEM, AND SYSTEM

(71) Applicant: SK hynix Inc., Icheon-si, Gyeonggi-do (KR)

(72) Inventor: Yong-Deok Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 275 days.

(21) Appl. No.: 15/205,213

(22) Filed: Jul. 8, 2016

(65) Prior Publication Data

US 2017/0249262 A1 Aug. 31, 2017

(30) Foreign Application Priority Data

Feb. 26, 2016 (KR) .................. 10-2016-0023596

(51) Int. Cl.
```
G06F 21/00      (2013.01)
G06F 12/14      (2006.01)
G06F 12/1009    (2016.01)
G11C 8/00       (2006.01)
```
(52) U.S. Cl.
CPC ...... *G06F 12/1408* (2013.01); *G06F 12/1009* (2013.01); *G11C 8/00* (2013.01); *G06F 2212/1052* (2013.01)

(58) Field of Classification Search
CPC . G06Q 20/341; G06Q 20/40975; G07F 7/082
See application file for complete search history.

(56) References Cited

U.S. PATENT DOCUMENTS

| | | | | |
|---|---|---|---|---|
| 7,194,627 | B2* | 3/2007 | Cheung | G06F 21/85 713/168 |
| 7,913,307 | B2* | 3/2011 | Esaka | G06F 21/85 711/164 |
| 8,683,217 | B2* | 3/2014 | Gammel | G06F 21/85 380/277 |
| 2002/0095574 | A1* | 7/2002 | Kori | H04L 9/32 713/170 |
| 2010/0131747 | A1* | 5/2010 | Kurimoto | G06F 21/78 713/2 |
| 2014/0310717 | A1 | 10/2014 | Chamberlain et al. | |

\* cited by examiner

*Primary Examiner* — Ghazal B Shehni
(74) *Attorney, Agent, or Firm* — William Park & Associates Ltd.

(57) ABSTRACT

A semiconductor device, semiconductor system, and system may be provided. The semiconductor system may include one semiconductor device of a first semiconductor device and a second semiconductor device suitable for transmitting and receiving addresses and encrypted data. The one semiconductor device may include an address output circuit configured to output the addresses. The one semiconductor device may include an encryption circuit configured to output the encrypted data based on normal data and the addresses. The one semiconductor device may include a decryption circuit configured to output the normal data based on the addresses and the encrypted data.

7 Claims, 5 Drawing Sheets

SEMICONDUCTOR DEVICE, SEMICONDUCTOR SYSTEM, AND SYSTEM

CROSS-REFERENCES TO RELATED APPLICATION

The present application claims priority under 35 U.S.C. § 119(a) to Korean application number 10-2016-0023596, filed on Feb. 26, 2016, in the Korean Intellectual Property Office, which is incorporated herein by reference in its entirety.

BACKGROUND

1. Technical Field

Various embodiments may generally relate to a semiconductor integrated circuit, and, more particularly, to a semiconductor device, semiconductor system, and system.

2. Related Art

A semiconductor integrated circuit may exchange signals with another semiconductor integrated circuit. The signals transmitted and received between the semiconductor integrated circuits may be signals such as data, address, clock and command signals.

A semiconductor integrated circuit may include a controller, and a memory device, etc.

Encryption of the signals to be transmitted and received may be necessary, for security, in the transmission and reception of signals between the semiconductor integrated circuits or the transmission and reception of signals between the controller and the memory device.

SUMMARY

In an embodiment, there may be provided a semiconductor system wherein one semiconductor device of a first semiconductor device and a second semiconductor device suitable for transmitting and receiving addresses and encrypted data may include: an address output circuit configured to output the addresses; an encryption circuit configured to output the encrypted data based on normal data and the addresses; and a decryption circuit configured to output the normal data based on the addresses and the encrypted data.

In an embodiment, a controller of a semiconductor system may be provided. The controller may include an address output circuit configured to provide addresses to a memory device. The controller may include an encryption circuit configured to generate encrypted data based on normal data and mapping addresses, and output the encrypted data to the memory device. The controller may include a decryption circuit configured to generate the normal data based on the encrypted data provided from the memory device and the mapping addresses. The controller may include an encryption control circuit configured to generate the mapping addresses based on a control signal and the addresses.

In an embodiment, there may be provided a semiconductor device. The semiconductor device may include an address output circuit configured to generate addresses and output the addresses externally from the semiconductor device. The semiconductor device may include an encryption circuit configured to generate encrypted data based on normal data and mapping addresses, and output the encrypted data externally from the semiconductor device. The semiconductor device may include a decryption circuit configured to generate the normal data based on the encrypted data received externally from the semiconductor device and the mapping addresses. The semiconductor device may include an encryption control circuit configured to generate the mapping addresses based on the addresses.

DETAILED DESCRIPTION

Hereinafter, a semiconductor system will be described below with reference to the accompanying drawings through various examples of embodiments.

Figure 1:
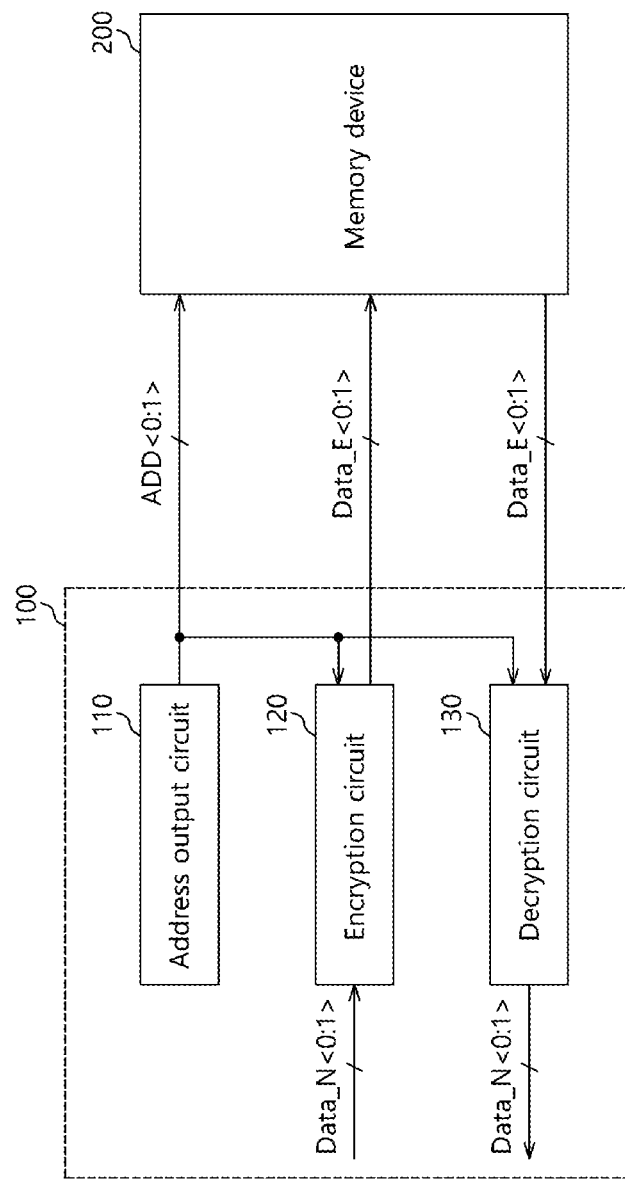
FIG. 1 is a configuration diagram illustrating a representation of an example of a semiconductor system in accordance with an embodiment.

Referring to FIG. 1, a semiconductor system in accordance with an embodiment may include a first semiconductor device 100 and a second semiconductor device 200. The first semiconductor device 100 may be a controller, and the second semiconductor device 200 may be a memory device. Hereafter, the first semiconductor device 100 will be referred to as a controller 100, and the second semiconductor device 200 will be referred to as a memory device 200.

The controller 100 may provide addresses ADD<0:1> and encrypted data Data_E<0:1> to the memory device 200. The controller 100 may be inputted with the encrypted data Data_E<0:1> from the memory device 200. The controller 100 encrypts normal data Data_N<0:1> and provides the encrypted data Data_E<0:1> to the memory device 200. For example, the controller 100 may provide the encrypted data Data_E<0:1> by encoding the normal data Data_N<0:1>.

The memory device 200 may store the encrypted data Data_E<0:1> provided from the controller 100, and provide the encrypted data Data_E<0:1> stored therein, to the controller 100. When the memory device 200 is provided with the encrypted data Data_E<0:1> from the controller 100, the memory device 200 is also provided with the addresses ADD<0:1>. When the memory device 200 provides the encrypted data Data_E<0:1> to the controller 100, the memory device 200 is provided with the addresses ADD<0:1> from the controller 100.

The controller 100 may include an address output circuit 110, an encryption circuit 120, and a decryption circuit 130.

The address output circuit 110 may provide the addresses ADD<0:1> to the memory device 200. The addresses ADD<0:1> may be signals which designate positions where the encrypted data Data_E<0:1> provided to the memory device 200 from the controller 100 are to be stored.

The encryption circuit 120 may generate the encrypted data Data_E<0:1> in response to the normal data Data_N<0:1> and the addresses ADD<0:1>, and provide the generated encrypted data Data_E<0:1> to the memory device 200. For example, the encryption circuit 120 encrypts the normal data Data_N<0:1> in response to the addresses ADD<0:1>, and provides the encrypted normal data Data_N<0:1> as the encrypted data Data_E<0:1> to the memory device 200. The encryption circuit 120 may provide the encrypted data Data_E<0:1> generated by encoding the normal data Data_N<0:1> and the addresses ADD<0:1> to the memory device 200.

The decryption circuit 130 may generate the normal data Data_N<0:1> in response to the addresses ADD<0:1> and the encrypted data Data_E<0:1> inputted from the memory device 200. For example, the decryption circuit 130 may decrypt the encrypted data Data_E<0:1> in response to the addresses ADD<0:1>, and output the decrypted encrypted data Data_E<0:1> as the normal data Data_N<0:1>. The decryption circuit 130 may generate the normal data Data_N<0:1> by decoding the encrypted data Data_E<0:1> and the addresses ADD<0:1>.

Figure 2:
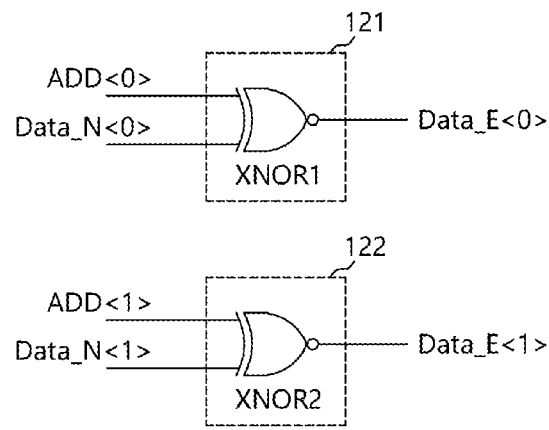
FIG. 2 is a configuration diagram illustrating a representation of an example of the encryption circuit illustrated in FIG. 1.

Referring to FIG. 2, the encryption circuit 120 may include first and second logic combining circuits 121 and 122. The addresses ADD<0:1> may include a first address ADD<0> and a second address ADD<1>. The normal data Data_N<0:1> may include first normal data Data_N<0> and second normal data Data_N<1>. The encrypted data Data_E<0:1> may include first encrypted data Data_E<0> and second encrypted data Data_E<1>.

The first logic combining circuit 121 may logically combine the first normal data Data_N<0> and the first address ADD<0>, and generate the first encrypted data Data_E<0>. For example, the first logic combining circuit 121 may generate the first encrypted data Data_E<0> of a first level when the first normal data Data_N<0> and the first address ADD<0> are the same level. The first logic combining circuit 121 may generate the first encrypted data Data_E<0> of a second level when the first normal data Data_N<0> and the first address ADD<0> are different levels. The first level and the second level may be different levels.

The first logic combining circuit 121 may be configured to perform an exclusive NOR operation. The first logic combining circuit 121 may include, for example, a first exclusive NOR gate XNOR1 or an equivalent thereof. The first exclusive NOR gate XNOR1 may be inputted with the first normal data Data_N<0> and the first address ADD<0>, and output the first encrypted data Data_E<0>.

The second logic combining circuit 122 may logically combine the second normal data Data_N<1> and the second address ADD<1>, and generate the second encrypted data Data_E<1>. For example, the second logic combining circuit 122 may generate the second encrypted data Data_E<1> of a first level when the second normal data Data_N<1> and the second address ADD<1> are the same level. The second logic combining circuit 122 may generate the second encrypted data Data_E<1> of a second level when the second normal data Data_N<1> and the second address ADD<1> are different levels. The first level and the second level may be different levels.

The second logic combining circuit 122 may be configured to perform an exclusive NOR operation. The second logic combining circuit 122 may include, for example, a second exclusive NOR gate XNOR2 or an equivalent thereof. The second exclusive NOR gate XNOR2 may be inputted with the second normal data Data_N<1> and the second address ADD<1>, and output the second encrypted data Data_E<1>.

Figure 3:
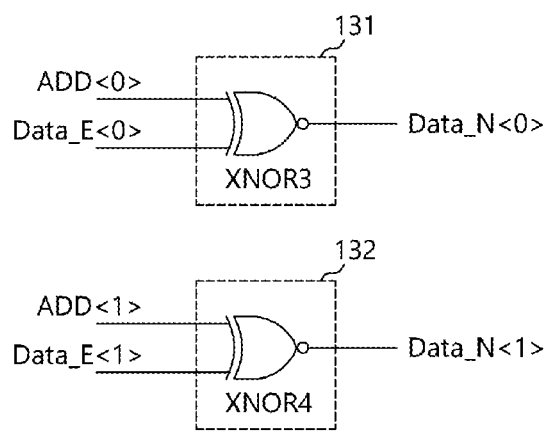
FIG. 3 is a configuration diagram illustrating a representation of an example of the decryption circuit illustrated in FIG. 1.

Referring to FIG. 3, the decryption circuit 130 may include third and fourth logic combining circuits 131 and 132.

The third logic combining circuit 131 may logically combine the first encrypted data Data_E<0> and the first address ADD<0>, and generate the first normal data Data_N<0>. For example, the third logic combining circuit 131 may generate the first normal data Data_N<0> of a first level when the first encrypted data Data_E<0> and the first address ADD<0> are the same level. The third logic combining circuit 131 may generate the first normal data Data_N<0> of a second level when the first encrypted data Data_E<0> and the first address ADD<0> are different levels. The first level and the second level may be different levels.

The third logic combining circuit 131 may be configured to perform an exclusive NOR operation. The third logic combining circuit 131 may include, for example, a third exclusive NOR gate XNOR3 or an equivalent thereof. The third exclusive NOR gate XNOR3 may be inputted with the first encrypted data Data_E<0> and the first address ADD<0>, and output the first normal data Data_N<0>.

The fourth logic combining circuit 132 may logically combine the second encrypted data Data_E<1> and the second address ADD<1>, and generate the second normal data Data_N<1>. For example, the fourth logic combining circuit 132 may generate the second normal data Data_N<1> of a first level when the second encrypted data Data_E<1> and the second address ADD<1> are the same level. The fourth logic combining circuit 132 may generate the second normal data Data_N<1> of a second level when the second encrypted data Data_E<1> and the second address ADD<1> are different levels. The first level and the second level may be different levels.

The fourth logic combining circuit 132 may be configured to perform an exclusive NOR operation. The fourth logic combining circuit 131 may include, for example, a fourth exclusive NOR gate XNOR4 or an equivalent thereof. The fourth exclusive NOR gate XNOR4 may be inputted with the second encrypted data Data_E<1> and the second address ADD<1>, and output the second normal data Data_N<1>.

The operation of the semiconductor system in accordance with an embodiment, configured as mentioned above, will be described below.

The controller 100 may provide the addresses ADD<0:1> and the encrypted data Data_E<0:1> to the memory device 200. The controller 100 encrypts the normal data Data_N<0:1> in response to the addresses ADD<0:1>, and provides the encrypted normal data Data_N<0:1> as the encrypted data Data_E<0:1> to the memory device 200.

The memory device 200 may be inputted with the addresses ADD<0:1> and the encrypted data Data_E<0:1> provided from the controller 100, and store the encrypted data Data_E<0:1> at the positions designated by the addresses ADD<0:1>.

The controller 100 may be provided with the encrypted data Data_E<0:1> stored in the memory device 200, from the memory device 200. At this time, the controller 100 may provide the addresses ADD<0:1> to the memory device 200.

The memory device 200 may be inputted with the addresses ADD<0:1> provided from the controller 100, and provide the encrypted data Data_E<0:1> stored at the positions designated by the addresses ADD<0:1>, to the controller 100.

The controller 100 may decrypt the encrypted data Data_E<0:1> provided from the memory device 200, in response to the addresses ADD<0:1>, and output the decrypted encrypted data Data_E<0:1> as the normal data Data_N<0:1>.

The operation of the semiconductor system in accordance with an embodiment, operating as mentioned above, will be described below.

It is assumed, for example, that the normal data Data_N<0:1> are (0,0) and the addresses ADD<0:1> are (0,1).

First, descriptions will be made for operations that the controller 100 provides the addresses ADD<0:1> and the encrypted data Data_E<0:1> to the memory device 200 and the memory device 200 stores the encrypted data Data_E<0:1> at the positions according to the addresses ADD<0:1>.

The address output circuit 110 provides the addresses ADD<0:1> to the memory device 200. The addresses ADD<0:1> are (0,1).

The encryption circuit 120 encrypts the normal data Data_N<0:1> in response to the addresses ADD<0:1>, and provides the encrypted normal data Data_N<0:1> as the encrypted data Data_E<0:1> to the memory device 200. Referring to FIG. 2, since the addresses ADD<0:1> are (0,1) and the normal data Data_N<0:1> are (0,0), the encrypted data Data_E<0:1> are generated as (1,0) and are provided to the memory device 200.

The memory device 200 stores the encrypted data Data_E<0:1> of (1,0) at the positions of the addresses ADD<0:1> of (0,1).

Next, descriptions will be made for operations that the controller 100 provides the addresses ADD<0:1> to the memory device 200 and the memory device 200 provides the encrypted data Data_E<0:1> stored at the positions of the provided addresses ADD<0:1>, to the controller 100.

The controller 100 provides the addresses ADD<0:1> of (0,1) to the memory device 200.

The memory device 200 provides the encrypted data Data_E<0:1> stored at the positions of the addresses ADD<0:1> of (0,1), to the controller 100. The encrypted data Data_E<0:1> stored at the positions of the addresses ADD<0:1> of (0,1) are (1,0).

The decryption circuit 130 of the controller 100 is inputted with the addresses ADD<0:1> of (0,1) and the encrypted data Data_E<0:1> of (1,0), and generates the normal data Data_N<0:1> of (0,0).

The semiconductor system in accordance with an embodiment is configured to, when transmitting and receiving data between the controller 100 and the memory device 200, logically combine addresses and normal data and transmit and receive encrypted data. The controller 100 may convert the encrypted data inputted from the memory device 200, into the normal data, by using the addresses.

Figure 4:
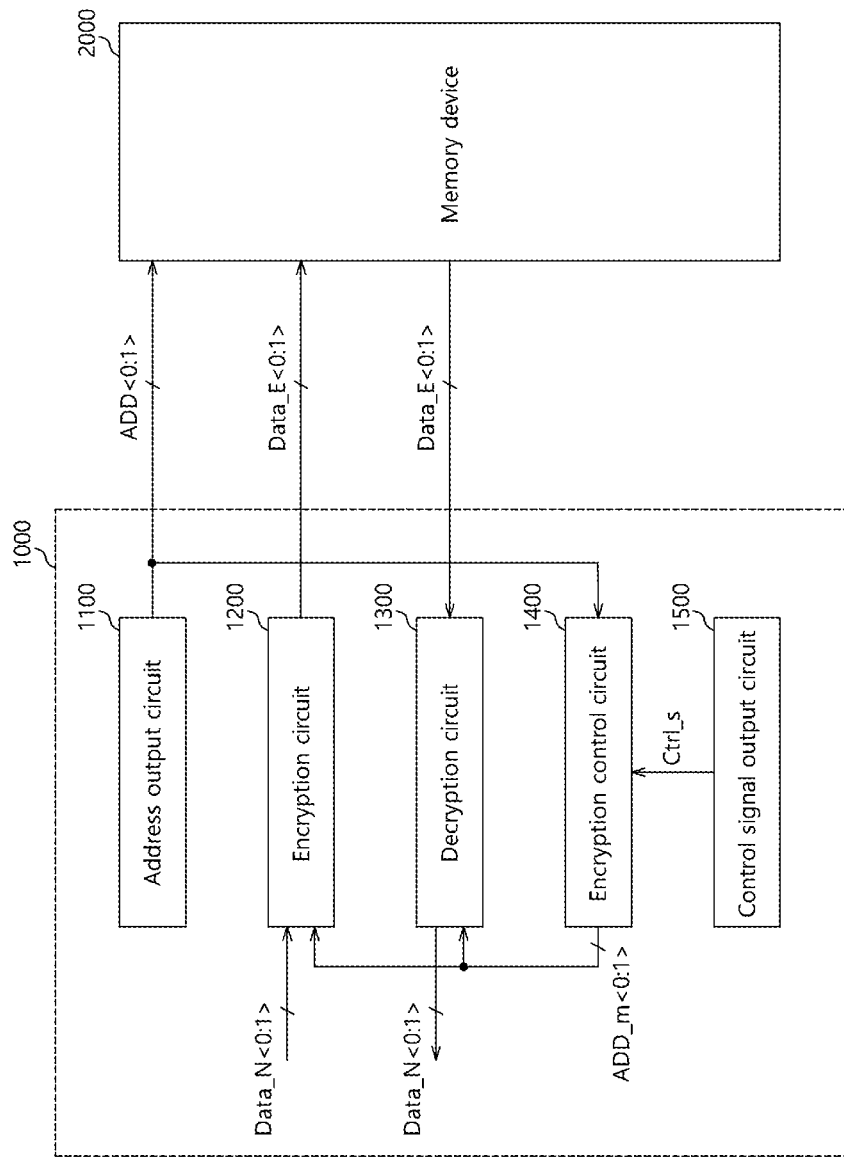
FIG. 4 is a configuration diagram illustrating a representation of an example of a semiconductor system in accordance with an embodiment.

Referring to FIG. 4, a semiconductor system in accordance with an embodiment may include a first semiconductor device 1000 and a second semiconductor device 2000. The first semiconductor device 1000 may be a controller, and the second semiconductor device 2000 may be a memory device. Hereafter, the first semiconductor device 1000 will be referred to as a controller 1000, and the second semiconductor device 2000 will be referred to as a memory device 2000.

The controller 1000 may provide addresses ADD<0:1> and encrypted data Data_E<0:1> to the memory device 2000. The controller 1000 may be inputted with the encrypted data Data_E<0:1> from the memory device 2000. The controller 1000 encrypts normal data Data_N<0:1> and provides the encrypted data Data_E<0:1> to the memory device 2000.

The memory device 2000 may store the encrypted data Data_E<0:1> provided from the controller 1000, and provide the encrypted data Data_E<0:1> stored therein, to the controller 1000. When the memory device 2000 is provided with the encrypted data Data_E<0:1> from the controller 1000, the memory device 2000 is also provided with the addresses ADD<0:1>. When the memory device 2000 provides the encrypted data Data_E<0:1> to the controller 1000, the memory device 2000 is provided with the addresses ADD<0:1> from the controller 1000.

The controller 1000 may include an address output circuit 1100, an encryption circuit 1200, a decryption circuit 1300, an encryption control circuit 1400, and a control signal output circuit 1500.

The address output circuit 1100 may provide the addresses ADD<0:1> to the memory device 2000. The addresses ADD<0:1> may be signals which designate positions where the encrypted data Data_E<0:1> provided to the memory device 2000 from the controller 1000 are to be stored.

The encryption circuit 1200 may generate the encrypted data Data_E<0:1> in response to the normal data Data_N<0:1> and mapping addresses ADD_m<0:1>, and provide the generated encrypted data Data_E<0:1> to the memory device 2000. For example, the encryption circuit 1200 encrypts the normal data Data_N<0:1> in response to the mapping addresses ADD_m<0:1>, and provides the encrypted normal data Data_N<0:1> as the encrypted data Data_E<0:1> to the memory device 2000.

The decryption circuit 1300 may generate the normal data Data_N<0:1> in response to the mapping addresses ADD_m<0:1> and the encrypted data Data_E<0:1> inputted from the memory device 2000. For example, the decryption circuit 1300 may decrypt the encrypted data Data_E<0:1> in response to the mapping addresses ADD_m<0:1>, and output the decrypted encrypted data Data_E<0:1> as the normal data Data_N<0:1>.

The encryption circuit 1200 may be configured in the same manner as the encryption circuit 120 of FIG. 1 except that only the input signal and the output signal thereof are different. Therefore, the encryption circuit 1200 may also include the first and second logic combining circuits 121 and 122, and each of the first and second logic combining circuits 121 and 122 may include, for example, an exclusive NOR gate. Since the detailed configuration of the encryption circuit 1200 is the same as the detailed configuration of the encryption circuit 120 of FIG. 1, detailed descriptions thereof will be omitted herein.

The decryption circuit 1300 may be configured in the same manner as the decryption circuit 130 of FIG. 1 except that only the input signal and the output signal thereof are different. Therefore, the decryption circuit 1300 may also include the third and fourth logic combining circuits 131 and 132, and each of the third and fourth logic combining circuits 131 and 132 may include, for example, an exclusive NOR gate. Since the detailed configuration of the decryption circuit 1300 is the same as the detailed configuration of the decryption circuit 130 of FIG. 1, detailed descriptions thereof will be omitted herein.

The encryption control circuit 1400 may generate the mapping addresses ADD_m<0:1> in response to the addresses ADD<0:1> and a control signal Ctrl_s. For example, the encryption control circuit 1400 converts the addresses ADD<0:1> in response to the control signal Ctrl_s, and outputs the converted addresses ADD<0:1> as the mapping addresses ADD_m<0:1>.

Figure 5:
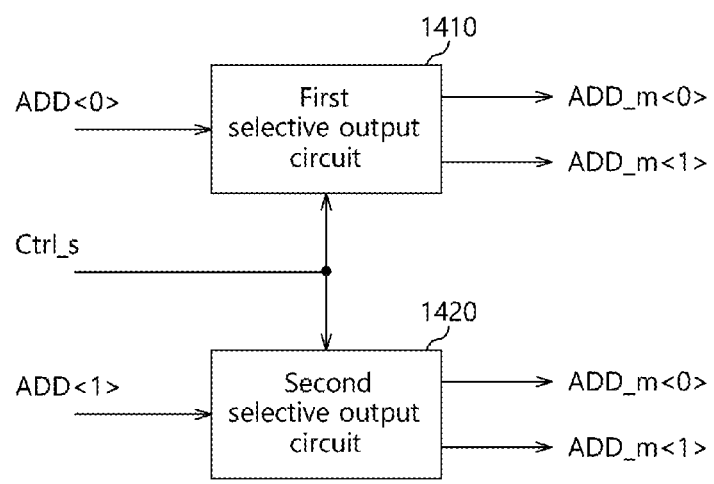
FIG. 5 is a configuration diagram illustrating a representation of an example of the encryption control circuit illustrated in FIG. 4.

Referring to FIG. 5, the encryption control circuit 1400 may include a first selective output circuit 1410 and a second selective output circuit 1420. The addresses ADD<0:1> may include a first address ADD<0> and a second address ADD<1>. The mapping addresses ADD_m<0:1> may include a first mapping address ADD_m<0> and a second mapping address ADD_m<1>.

The first selective output circuit 1410 may output the first address ADD<0> as the first mapping address ADD_m<0> or the second mapping address ADD_m<1> in response to the control signal Ctrl_s. For example, the first selective output circuit 1410 may output the first address ADD<0> as the first mapping address ADD_m<0>, when the control signal Ctrl_s is enabled. The first selective output circuit 1410 may output the first address ADD<0> as the second mapping address ADD_m<1>, when the control signal Ctrl_s is disabled. The first selective output circuit 1410 may perform the operation of a demultiplexer, or may be configured by, for example, a demultiplexer.

The second selective output circuit 1420 may output the second address ADD<1> as the first mapping address ADD_m<0> or the second mapping address ADD_m<1> in response to the control signal Ctrl_s. For example, the second selective output circuit 1420 may output the second address ADD<1> as the second mapping address ADD_m<1>, when the control signal Ctrl_s is enabled. The second selective output circuit 1420 may output the second address ADD<1> as the first mapping address ADD_m<0>, when the control signal Ctrl_s is disabled. The second selective output circuit 1420 may perform the operation of a demultiplexer, or may be configured by, for example, a demultiplexer.

The encryption control circuit 1400 configured in this way is a component which outputs the addresses ADD<0:1> as the mapping addresses ADD_m<0:1>, respectively, according to a predetermined rule. The encryption control circuit 1400 illustrated in FIGS. 4 and 5 outputs the first address ADD<0> as the first mapping address ADD_m<0> and outputs the second address ADD<1> as the second mapping address ADD_m<1> in the case where the control signal Ctrl_s is enabled. The encryption control circuit 1400 may output the first address ADD<0> as the second mapping address ADD_m<1> and output the second address ADD<1> as the first mapping address ADD_m<0> in the case where the control signal Ctrl_s is disabled.

The control signal output circuit 1500 may be configured by, for example, a register, and may set whether to enable or disable the control signal Ctrl_s.

The operation of the semiconductor system in accordance with an embodiment, configured as mentioned above, will be described below.

It is assumed, for example, that the control signal Ctrl_s is enabled, the normal data Data_N<0:1> are (0,0) and the addresses ADD<0:1> are (0,1).

First, descriptions will be made for operations that the controller 1000 provides the addresses ADD<0:1> and the encrypted data Data_E<0:1> to the memory device 2000 and the memory device 2000 stores the encrypted data Data_E<0:1> at the positions according to the addresses ADD<0:1>.

The address output circuit 1100 provides the addresses ADD<0:1> to the memory device 2000. The addresses ADD<0:1> are (0,1).

The encryption control circuit 1400 outputs the addresses ADD<0:1> as the mapping addresses ADD_m<0:1> in that sequence because the control signal Ctrl_s is enabled. For example, the encryption control circuit 1400 outputs the first address ADD<0> as the first mapping address ADD_m<0> and outputs the second address ADD<1> as the second mapping address ADD_m<1>, when the control signal Ctrl_s is enabled. Therefore, the encryption control circuit 1400 is inputted with the addresses ADD<0:1> of (0,1) and outputs the mapping addresses ADD_m<0:1> of (0,1), when the control signal Ctrl_s is enabled.

The encryption circuit 1200 encrypts the normal data Data_N<0:1> in response to the mapping addresses ADD_m<0:1>, and provides the encrypted normal data Data_N<0:1> as the encrypted data Data_E<0:1> to the memory device 2000. Referring to FIG. 2, since the mapping addresses ADD_m<0:1> are (0,1) and the normal data Data_N<0:1> are (0,0), the encrypted data Data_E<0:1> are generated as (1,0) and are provided to the memory device 2000.

The memory device 2000 stores the encrypted data Data_E<0:1> of (1,0) at the positions of the addresses ADD<0:1> of (0,1).

Next, descriptions will be made for operations that the controller 1000 provides the addresses ADD<0:1> to the memory device 2000 and the memory device 2000 provides the encrypted data Data_E<0:1> stored at the positions of the provided addresses ADD<0:1>, to the controller 1000.

The controller 1000 provides the addresses ADD<0:1> of (0,1) to the memory device 2000.

The memory device 2000 provides the encrypted data Data_E<0:1> stored at the positions of the addresses ADD<0:1> of (0,1), to the controller 1000. The encrypted data Data_E<0:1> stored at the positions of the addresses ADD<0:1> of (0,1) are (1,0).

The encryption control circuit 1400 of the controller 1000 is inputted with the addresses ADD<0:1> of (0,1) and outputs the mapping addresses ADD_m<0:1> of (0,1).

The decryption circuit 1300 of the controller 1000 is inputted with the mapping addresses ADD_m<0:1> of (0,1) and the encrypted data Data_E<0:1> of (1,0), and generates the normal data Data_N<0:1> of (0,0).

It is assumed, for example, that the control signal Ctrl_s is disabled, the normal data Data_N<0:1> are (0,0) and the addresses ADD<0:1> are (0,1).

First, descriptions will be made for operations that the controller 1000 provides the addresses ADD<0:1> and the encrypted data Data_E<0:1> to the memory device 2000 and the memory device 2000 stores the encrypted data Data_E<0:1> at the positions according to the addresses ADD<0:1>.

The address output circuit 1100 provides the addresses ADD<0:1> to the memory device 2000. The addresses ADD<0:1> are (0,1).

The encryption control circuit 1400 outputs the mapping addresses ADD_m<0:1> by reversing the sequence of the addresses ADD<0:1> because the control signal Ctrl_s is disabled. For example, the encryption control circuit 1400 outputs the first address ADD<0> as the second mapping address ADD_m<1> and outputs the second address ADD<1> as the first mapping address ADD_m<0>, when the control signal Ctrl_s is disabled. Therefore, the encryption control circuit 1400 is inputted with the addresses ADD<0:1> of (0,1) and outputs the mapping addresses ADD_m<0:1> of (1,0), when the control signal Ctrl_s is disabled.

The encryption circuit 1200 encrypts the normal data Data_N<0:1> in response to the mapping addresses ADD_m<0:1>, and provides the encrypted normal data Data_N<0:1> as the encrypted data Data_E<0:1> to the memory device 2000. Referring to FIG. 2, since the mapping addresses ADD_m<0:1> are (1,0) and the normal data Data_N<0:1> are (0,0), the encrypted data Data_E<0:1> are generated as (0,1) and are provided to the memory device 2000.

The memory device 2000 stores the encrypted data Data_E<0:1> of (0,1) at the positions of the addresses ADD<0:1> of (0,1).

Next, descriptions will be made for operations that the controller 1000 provides the addresses ADD<0:1> to the memory device 2000 and the memory device 2000 provides the encrypted data Data_E<0:1> stored at the positions of the provided addresses ADD<0:1>, to the controller 1000.

The controller 1000 provides the addresses ADD<0:1> of (0,1) to the memory device 2000.

The memory device 2000 provides the encrypted data Data_E<0:1> stored at the positions of the addresses ADD<0:1> of (0,1), to the controller 1000. The encrypted data Data_E<0:1> stored at the positions of the addresses ADD<0:1> of (0,1) are (0,1).

The encryption control circuit 1400 of the controller 1000 is inputted with the addresses ADD<0:1> of (0,1) and outputs the mapping addresses ADD_m<0:1> of (1,0).

The decryption circuit 1300 of the controller 1000 is inputted with the mapping addresses ADD_m<0:1> of (1,0) and the encrypted data Data_E<0:1> of (0,1), and generates the normal data Data_N<0:1> of (0,0).

As is apparent from the above descriptions, a semiconductor system in accordance with the embodiments may encrypt data to be transmitted and received between a controller and a memory device and may transmit and receive encrypted data between the controller and the memory device, whereby it may be possible to improve security of the semiconductor system. In addition, since the semiconductor system includes an encryption control circuit as illustrated in FIG. 4, a data encryption scheme may be changed, whereby it may be possible to ensure a higher degree of security reliability.

Figure 6:
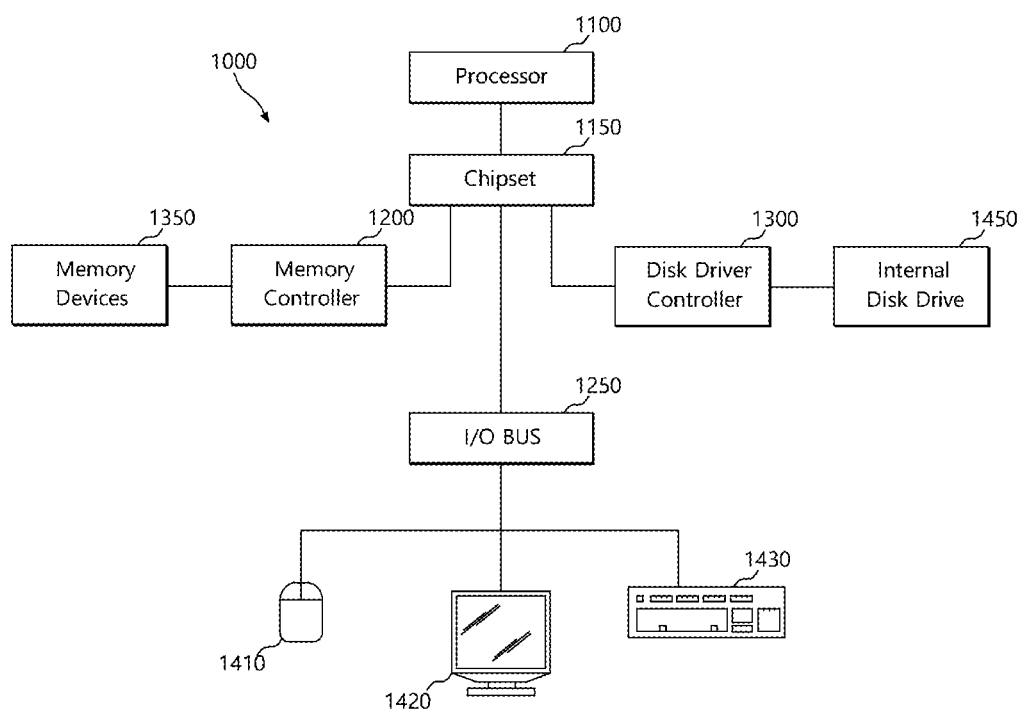
FIG. 6 illustrates a block diagram of an example of a representation of a system employing a semiconductor system and or semiconductor device with the various embodiments discussed above with relation to FIGS. 1-5.

The semiconductor devices and semiconductor systems as discussed above (see FIGS. 1-5) are particular useful in the design of memory devices, processors, and computer systems. For example, referring to FIG. 6, a block diagram of a system employing a semiconductor device and/or a semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or semiconductor system as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or semiconductor system as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a semiconductor device and or semiconductor system as discussed above with relation to FIGS. 1-5. In alternate embodiments, such as, for example but not limited to, cellular phones or digital cameras, the components may differ from the embodiments illustrated in FIG. 6.

While various embodiments have been described above, it will be understood to those skilled in the art that the embodiments described are examples only. Accordingly, the semiconductor system or systems described herein should not be limited based on the described embodiments.

What is claimed is:
1. A semiconductor system, comprises:
a controller; and
a memory device configured to receive mapping addresses and encrypted data from the controller, store the encrypted data in a location specified by the mapping address and, transmit stored encrypted data to the controller,
wherein the controller includes:
an address output circuit configured to output the mapping addresses;

an encryption circuit configured to receive normal data and output the encrypted data based on normal data by using the mapping addresses provided from the address output circuit; and a decryption circuit configured to receive the stored encrypted data from the memory device and output the normal data by executing the stored encrypted data in response to the mapping addresses.

2. The semiconductor system according to claim 1, wherein the encryption circuit performs a logic operation with the normal data and the addresses, and outputs the encrypted data.

3. The semiconductor system according to claim 2, wherein the encryption circuit comprises a plurality of logic combining circuits which logically combine the normal data and the addresses.

4. The semiconductor system according to claim 3, wherein each logic combining circuit outputs encrypted data of a first level when normal data and an address are the same level, and outputs encrypted data of a second level when normal data and an address are different levels, wherein the first level is a level different from the second level.

5. The semiconductor system according to claim 1, wherein the decryption circuit performs a logic operation with the encrypted data and the addresses, and outputs the normal data.

6. The semiconductor system according to claim 5, wherein the decryption circuit comprises a plurality of logic combining circuits which logically combine the encrypted data and the addresses.

7. The semiconductor system according to claim 6, wherein each logic combining circuit outputs normal data of a first level when encrypted data and an address are the same level, and outputs normal data of a second level when encrypted data and an address are different levels, wherein the first level is a level different from the second level.

* * * * *